(12) United States Patent
Shareef et al.

(10) Patent No.: US 8,794,267 B2
(45) Date of Patent: Aug. 5, 2014

(54) GAS TRANSPORT DELAY RESOLUTION FOR SHORT ETCH RECIPES

(75) Inventors: Iqbal Shareef, Fremont, CA (US);
Mark Taskar, San Mateo, CA (US);
Tony Zemlock, Tracy, CA (US)

(73) Assignee: Lam Research Corporation, Fremont, CA (US)

( * ) Notice: Subject to any disclaimer, the term of this patent is extended or adjusted under 35 U.S.C. 154(b) by 725 days.

(21) Appl. No.: 12/810,756

(22) PCT Filed: Dec. 17, 2008

(86) PCT No.: PCT/US2008/087270
§ 371 (c)(1),
(2), (4) Date: Sep. 22, 2010

(87) PCT Pub. No.: WO2009/085866
PCT Pub. Date: Jul. 9, 2009

(65) Prior Publication Data
US 2011/0005601 A1    Jan. 13, 2011

Related U.S. Application Data

(60) Provisional application No. 61/016,908, filed on Dec. 27, 2007.

(51) Int. Cl.
*F16K 11/10*    (2006.01)
(52) U.S. Cl.
USPC .......................................... 137/884; 118/715
(58) Field of Classification Search
CPC ................................................. C23C 16/45561
USPC .......................................... 137/884; 117/715
See application file for complete search history.

(56) References Cited

U.S. PATENT DOCUMENTS

| | | | | |
|---|---|---|---|---|
| 4,369,031 | A * | 1/1983 | Goldman et al. | 432/198 |
| 5,368,062 | A * | 11/1994 | Okumura et al. | 137/240 |
| 5,605,179 | A * | 2/1997 | Strong et al. | 137/884 |
| 5,653,807 | A * | 8/1997 | Crumbaker | 118/715 |
| 5,662,143 | A * | 9/1997 | Caughran | 137/884 |
| 5,769,110 | A * | 6/1998 | Ohmi et al. | 137/269 |
| 5,951,772 | A * | 9/1999 | Matsuse et al. | 118/723 R |
| 6,251,188 | B1 * | 6/2001 | Hashimoto et al. | 118/715 |
| 6,283,143 | B1 * | 9/2001 | Adachi et al. | 137/341 |

(Continued)

FOREIGN PATENT DOCUMENTS

| JP | 11002400 A | 6/1999 |
|---|---|---|
| JP | 3387777 B2 | 1/2003 |
| WO | WO00/63756 | 10/2000 |
| WO | WO2007/081686 | 7/2007 |

OTHER PUBLICATIONS

International Search Report dated Aug. 11, 2009 from International Application No. PCT/US2008/087270.

(Continued)

*Primary Examiner* — John Fox
(74) *Attorney, Agent, or Firm* — Beyer Law Group LLP

(57) ABSTRACT

In one embodiment, an apparatus for providing a gas mixture of a plurality of gases, may have a plurality of mass flow controllers (MFCs), a mixing manifold in fluid connection with each plurality of MFCs, a plurality of mixing manifold exits positioned on the mixing manifold; and an isolation device in fluid connection with each of the plurality of mixing manifold exits.

16 Claims, 12 Drawing Sheets

(56) References Cited

U.S. PATENT DOCUMENTS

| | | | |
|---|---|---|---|
| 6,333,272 B1 | 12/2001 | McMillin et al. | |
| 6,499,502 B1 * | 12/2002 | Girard et al. | 137/240 |
| 6,752,166 B2 * | 6/2004 | Lull et al. | 137/9 |
| 6,769,463 B2 | 8/2004 | Vu | |
| 6,772,781 B2 * | 8/2004 | Doty et al. | 137/9 |
| 7,343,926 B2 * | 3/2008 | Okabe et al. | 137/240 |
| 7,424,894 B2 * | 9/2008 | Lull et al. | 137/9 |
| 8,104,516 B2 * | 1/2012 | Moriya et al. | 137/884 |
| 8,196,609 B2 * | 6/2012 | Oya et al. | 137/884 |
| 2004/0163590 A1 | 8/2004 | Tran et al. | |
| 2006/0237063 A1 * | 10/2006 | Ding et al. | 137/487.5 |
| 2007/0158025 A1 | 7/2007 | Larson et al. | |
| 2008/0167748 A1 | 7/2008 | Ding et al. | |

OTHER PUBLICATIONS

Written Opinion dated Aug. 11, 2009 from International Application No. PCT/US2008/087270.
Written Opinion dated Mar. 14, 2012 from Singapore Patent Application No. 201004477-4.
Search Report dated Mar. 14, 2012 from Singapore Patent Application No. 201004477-4.
Written Opinion dated Nov. 15, 2012 from Singapore Patent Application No. 201004477-4.
Office Action dated Aug. 28, 2012 from Japanese Patent Application No. JP2010-540793.

* cited by examiner

GAS TRANSPORT DELAY RESOLUTION FOR SHORT ETCH RECIPES

CROSS REFERENCE TO RELATED APPLICATIONS

This application claims priority under 35 U.S.C. §119 (e) to U.S. Provisional Patent Application No. 61/016,908, filed on Dec. 27, 2007, entitled "Gas Transport Delay Resolution for Short Etch Recipes", which is incorporated by reference herein for all purposes.

FIELD OF THE INVENTION

The present disclosure relates generally to gas delivery systems. More particularly, the present invention relates to a gas delivery system to reduce gas transport delays. Even more particularly, the present invention relates to a gas delivery system to reduce gas transport delays to efficiently mixing process gases.

BACKGROUND OF THE INVENTION

Process gasses are delivered from a gas box to a process chamber for various applications, such as reactive ion etching applications for building transistors on silicon wafers. Process gases are mixed downstream of the mass flow controllers (MFCs) to a mixing manifold prior to delivery to the process chamber, such as a plasma reaction chamber. Therefore, it is necessary to achieve good mixing of very low flow and high flow rate carrier gases in the mixing manifold and deliver them without significant delays (within allowed gas settlement times) to the process chamber to perform the various applications, such as etching.

Transient gas flow delays to the process chamber, which are greater than the allowed gas settlement times, affect etch rates adversely for short process recipes (30 seconds to 60 seconds processes) due to non-stabilized or unsteady flows to the chamber. The problem is further enhanced due to hardware differences in various gas boxes causing different transport delays to process chambers to create etch rate matching issues. In a gas-box with multiple gas feeds of low and high flow rate gases, spatially separated in a random gas order from various MFCs, are bound to be delivered at different times to the process chamber depending upon their diffusivity and flow velocities (momentum or inertia).

The gas delay delivery problems may be attributed to the volume through which low flow gases flow to mix with the higher flow carrier gas(es). Delayed delivery of key process etching gases to the reaction chamber impacts wafer etch rates and critical dimensions on silicon wafers. In a mixing manifold with an isolated low flow gas, located away from a high flow gas, will take some physical length of time to mix with higher flow gas used to speed-up the deliver of the gas mixture to the chamber. The time required to fill the low flow gas volume from the MFC until it mixes with the high flow gas, as well as its diffusion through the high flow gas, determines the total transport delay to the reaction chamber.

OVERVIEW

The present invention provides for an apparatus, method, and system to reduce gas transport delays and to efficiently mix process gases in a gas delivery system. In one embodiment, an apparatus for providing a gas mixture of a plurality of gases, may have a plurality of mass flow controllers (MFCs), a mixing manifold in fluid connection with each plurality of MFCs, a plurality of mixing manifold exits positioned on the mixing manifold; and an isolation device in fluid connection with each of the plurality of mixing manifold exits.

In another embodiment, a method for dynamically mixing a plurality of gases, may comprise receiving a first gas at a first gas inlet to a mixing manifold, the first gas being received at a first flow rate, receiving a second gas at a second gas inlet to the mixing manifold, the second gas being received at a second flow rate, determining whether the first flow rate is less than the second flow rate, and automatically opening a first mixing manifold exit proximate to the first gas inlet when the determining determines that the first flow rate is less than the second flow rate.

The present invention provides other hardware configured to perform the methods of the invention, as well as software stored in a machine-readable medium (e.g., a tangible storage medium) to control devices to perform these methods. These and other features will be presented in more detail in the following detailed description of the invention and the associated figures.

BRIEF DESCRIPTION OF THE DRAWINGS

The accompanying drawings, which are incorporated into and constitute a part of this specification, illustrate one or more example embodiments and, together with the description of example embodiments, serve to explain the principles and implementations.

In the drawings.

DESCRIPTION OF EXAMPLE EMBODIMENTS

Embodiments are described herein in the context of gas transport delay resolution for short etch recipes. The following detailed description is illustrative only and is not intended to be in any way limiting. Other embodiments will readily suggest themselves to such skilled persons having the benefit of this disclosure. Reference will now be made in detail to implementations as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
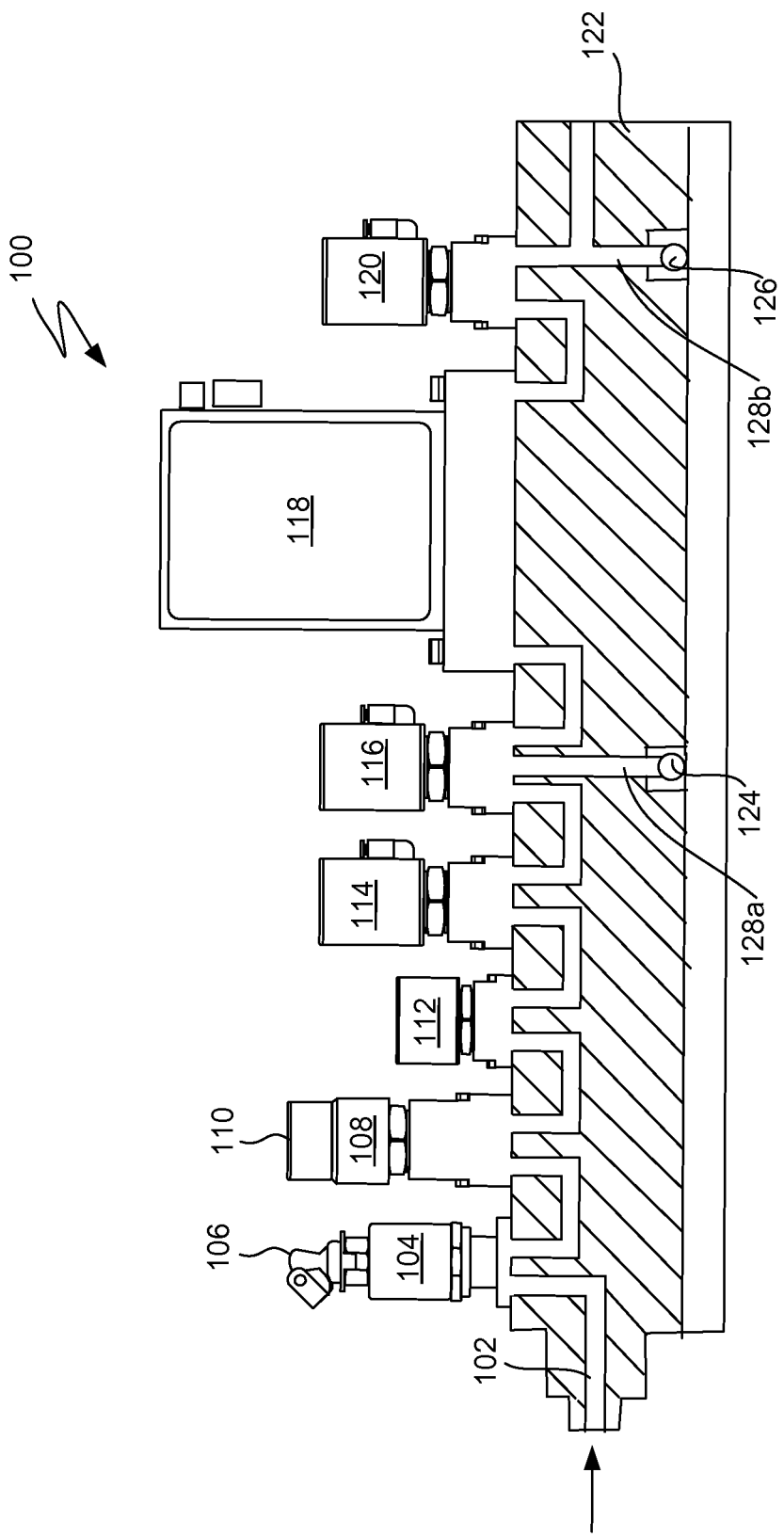
FIGS. 1A and 1B illustrate an exemplary gas stick.
Figure 1B:
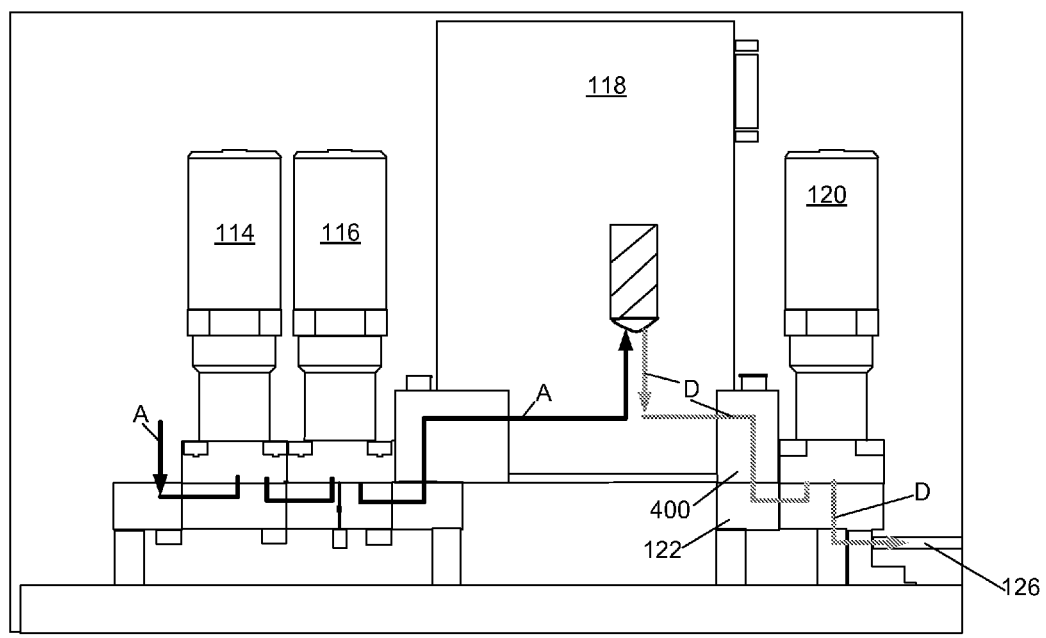

The present invention provides for an apparatus, method, and system to reduce gas transport delays and to efficiently mix process gases in a gas delivery system. FIGS. 1A and 1B illustrate an exemplary gas stick. Although illustrated with certain components, the specific components are not intended to be limiting as different components may be used and/or less or more components may be used to form the gas stick. Additionally, although described with a single gas stick, the number of gas sticks is not intended to be limiting. As discussed above, a plurality of gas sticks, form a gas box or panel. In an embodiment, the valve on the components is an integrated surface mount valve. In general, an integrated surface mount component is a gas control component (e.g., valve, filter, etc.) that is connected to other gas control components through channels on a substrate assembly, upon which the gas control components are mounted. This is in contrast to gas control components that are generally attached through bulky conduits with VCR attachments (vacuum coupled ring).

Referring to FIG. 1A, the gas stick 100 may have a gas stick input port 102 to input a supply gas. The term gas used herein is not intended to be limiting and is meant to include any liquid, gas, or a combination of liquid and gas. A manual valve 104 may be used for carrying out the supply or isolation of the supply of supply gas. The manual valve 104 may also have a lockout/tagout device 106 above it. Worker safety regulations often mandate that plasma processing manufacturing equipment include activation prevention capability, such as a lockout/tagout mechanism. Generally a lockout is a device that uses positive means such as a lock, either key or combination type, to hold an energy-isolating device in a safe position. A tagout device is generally any prominent warning device, such as a tag and a means of attachment that can be securely fastened to energy-isolating device in accordance with an established procedure.

A regulator 108 may be used to regulate the gas pressure or the supply gas and a pressure gauge 110 may be used to monitor the pressure of the supply gas. In one embodiment, the pressure may be preset and not need to be regulated. In another embodiment, a pressure transducer (not illustrated) having a display to display the pressure may be used. The pressure transducer may be positioned next to the regulator 108. A filter 112 may be used to remove impurities in the supply gas. A primary shut-off valve 114 may be used to prevent any corrosive supply gasses from remaining in the gas stick. The primary shut-off valve 114 may be two-port valve having an automatic pneumatically operated valve assembly that causes the valve to become deactivated (closed), which in turn effectively stops plasma gas flow within the gas stick. Once deactivated, a non-corrosive purge gas, such as nitrogen, may be used to purge the gas stick. The purge valve 116 may have three-ports to provide for the purge process—an entrance port, an exit port and a discharge port.

Adjacent the purge valve 116 may be an MFC 118. The MFC 118 accurately measures the flow rate of the supply gas. Positioning the purge valve 116 next to the MFC 118 allows a user to purge any corrosive supply gasses in the MFC 118. A mixing valve 120 next to the MFC 118 may be used to control the amount of supply gas to be mixed with other supply gasses on the gas panel.

Each component of the gas stick may be positioned above a manifold block. A plurality of manifold blocks form a substrate 122, a layer of manifold blocks that creates the flow path of gasses through the gas stick 100. The gas delivery components may be positioned on the manifold blocks by any known means such as with a pressure fitting sealant (e.g., C-seal) and the like.

FIG. 1B illustrates the current flow of gases through the gas stick 100. The gas may flow out of from the purge valve 116 and into the MFC 118 in the direction of flow path A. The gas may then flow out of the MFC 118 into the substrate 122, through the mixing valve 120 and into the mixing manifold 226 as illustrated by flow path D.

Figure 2:
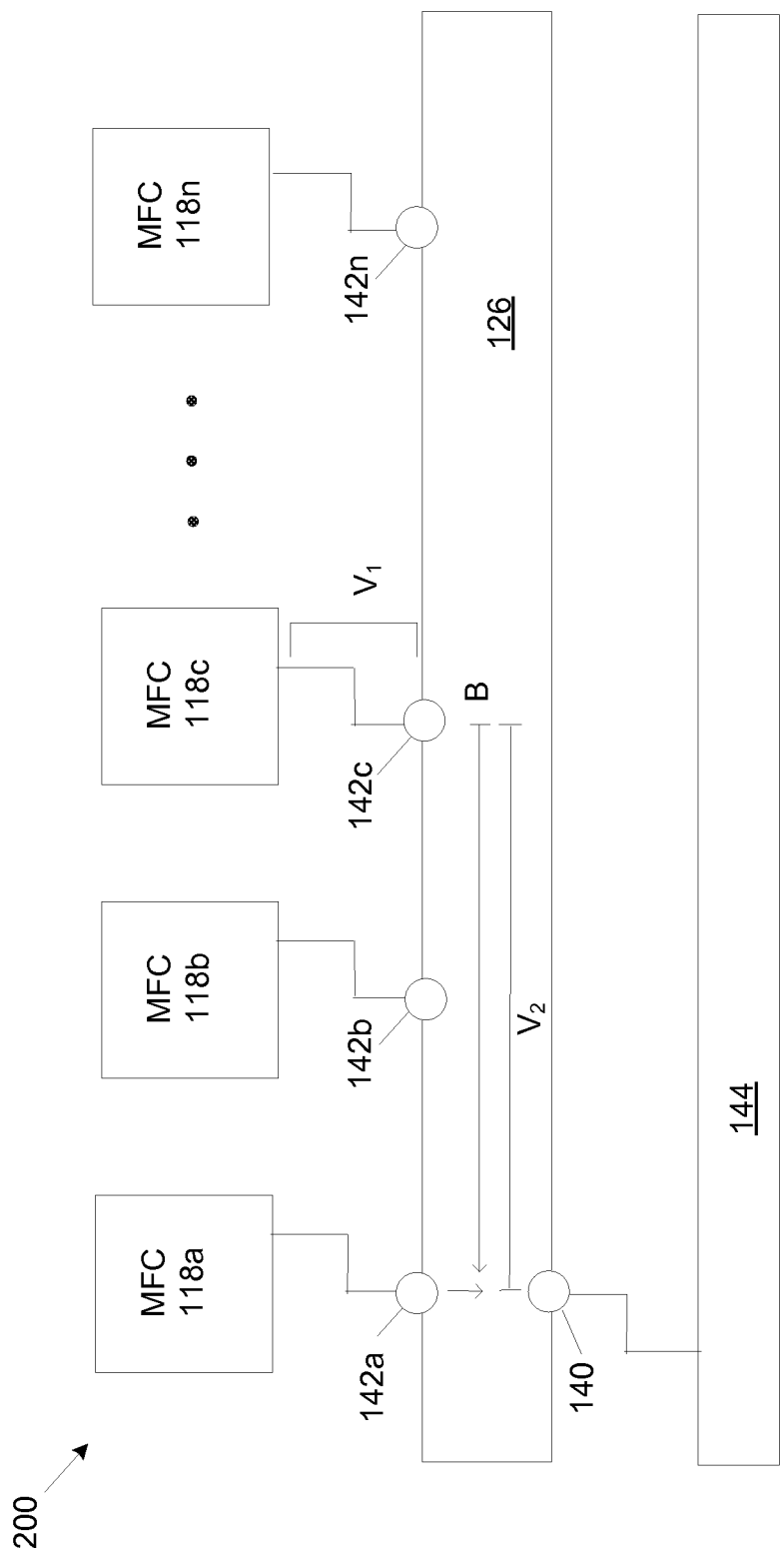
FIG. 2 is a block diagram of FIG. 1B to illustrate the delay time of a low flow gas.

FIG. 2 is a block diagram of FIG. 1B to illustrate the delay time of a low flow gas. The gas box 200 may have a plurality of MFCs $118a$, $118b$, $118c$, $118n$ (where n is an integer). Each MFC may be a high flow MFC or a low flow MFC. A low flow gas may have a flow rate of less than or equal to 7 sccm. A high flow gas may have a flow rate greater than 7 sccm. For exemplary purposes only and not intended to be limiting, as illustrated in FIG. 2, MFC $118c$ is illustrated as a low flow MFC and MFC $118a$ is illustrated as a high flow MFC. However, any MFC may be either a high flow MFC or a low flow MFC.

Each MFC $118a$-$118n$, may be in fluid communication with the mixing manifold 126 via gas inlet $142a$, $142b$, $142c$, $142n$. The gas inlet may be any type of inlet that may be manually or remotely controlled. For example, the gas inlet may be any known junction that may be manually positioned in an open or closed position. In another example, the gas inlet may be any known valve that may be controlled via a remote server or controller to be remotely and/or automatically positioned in an open or closed position. The volume of gas from the MFC $118a$-$118n$ to the gas inlet $142a$-$n$ may be represented by $V_1$. Once the gas enters the mixing manifold 126, it may flow in the direction of flow path B to a mixing manifold exit 140 near the high flow MFC $118a$. The high flow carrier gas causes a high forced convection to drive the low flow gas toward the mixing manifold exit 140 thereby attempting to minimizing delay of the mixing with the low flow gas. The volume of gas from the gas inlet $142c$ to the mixing manifold exit 140 may be represented by $V_2$.

Once the gas mixture exits the mixing manifold 126, the gas mixture may be flowed and retained in an isolation chamber 144 until it is used in a process chamber. The isolation chamber may be any type of chamber used to isolate the gas prior to being used, such as a dual gas feed, or the like.

The total delay time of a low flow gas to mix with a high flow carrier gas (Total Delay Time$_{Low\ Flow\ Gas}$) may be calculated as the time it takes for the low flow gas to reach the mixing manifold ($T_{mm}$) plus the time it takes the gas to diffuse ($T_{diffusion}$) with the high flow carrier gas, as illustrated in the following equation:

$$\text{Total Delay Time}_{Low\ Flow\ Gas} = T_{mm} + T_{diffusion} \quad (1)$$

The time for the low flow gas to reach the mixing manifold 126, or the inertial delay of the low flow gas (illustrated as $V_1$), may be calculated as follows:

$$T_{mm} = (V/\phi_m) * (P_{mm}/P_{ambient}) \quad (2)$$

Wherein V=volume of the gas
$\phi_m$=mass flow rate of the low flow gas
$P_{mm}$=pressure in the mixing manifold
$P_{ambient}$=ambient pressure The time it takes the low flow gas to diffuse ($T_{diffusion}$) with the high flow carrier gas, may be calculated as follows:

$$T_{diffusion} \alpha L^2/De_{ffective} \quad (3)$$

Wherein $L^2$=diffusion coefficient of the low flow gas
$D_{effective}$=effective rate of diffusion Example 1

The examples provided herein are merely for exemplary purposes and are not intended to be limiting. The current volume of a low flow gas from the MFC to the mixing manifold may be between about 4-5 cubic centimeters (cc), the pressure in the mixing manifold may be about 100 Torr, and $P_{ambient}$ may be 760 Torr. Thus, the delay time for a low flow gas to reach the mixing manifold ($T_{mm}$) may be calculated as follows:

$$\varphi_m = 1 \; sccm \quad (4)$$
$$P_{mm} = 100 \; Torr$$
$$P_{ambient} = 760 \; Torr$$
$$V = 5 \; cm/sec$$
$$T_{mm} = \frac{5 \; cm/second}{1 \; sccm} \times \frac{100 \; Torr}{760 \; Torr} = 40 \; seconds$$

Thus, a 40 second delay in the flow of a gas to the mixing manifold would adversely affect etch rates for short process recipes that are 30 seconds to 60 seconds long, such as in reactive ion etching or gas modulated applications as the process gases may not be mixed properly or the process gases may not even be mixed together in the mixing manifold. Additionally, the slower the flow rate, the greater the delay will be. Thus, a way to reduce the time delay may be to lower the gas volume from the MFC 118a-n to the mixing manifold 126 or locate the mixing manifold exit 140 near a low flow MFC.

Figure 3:
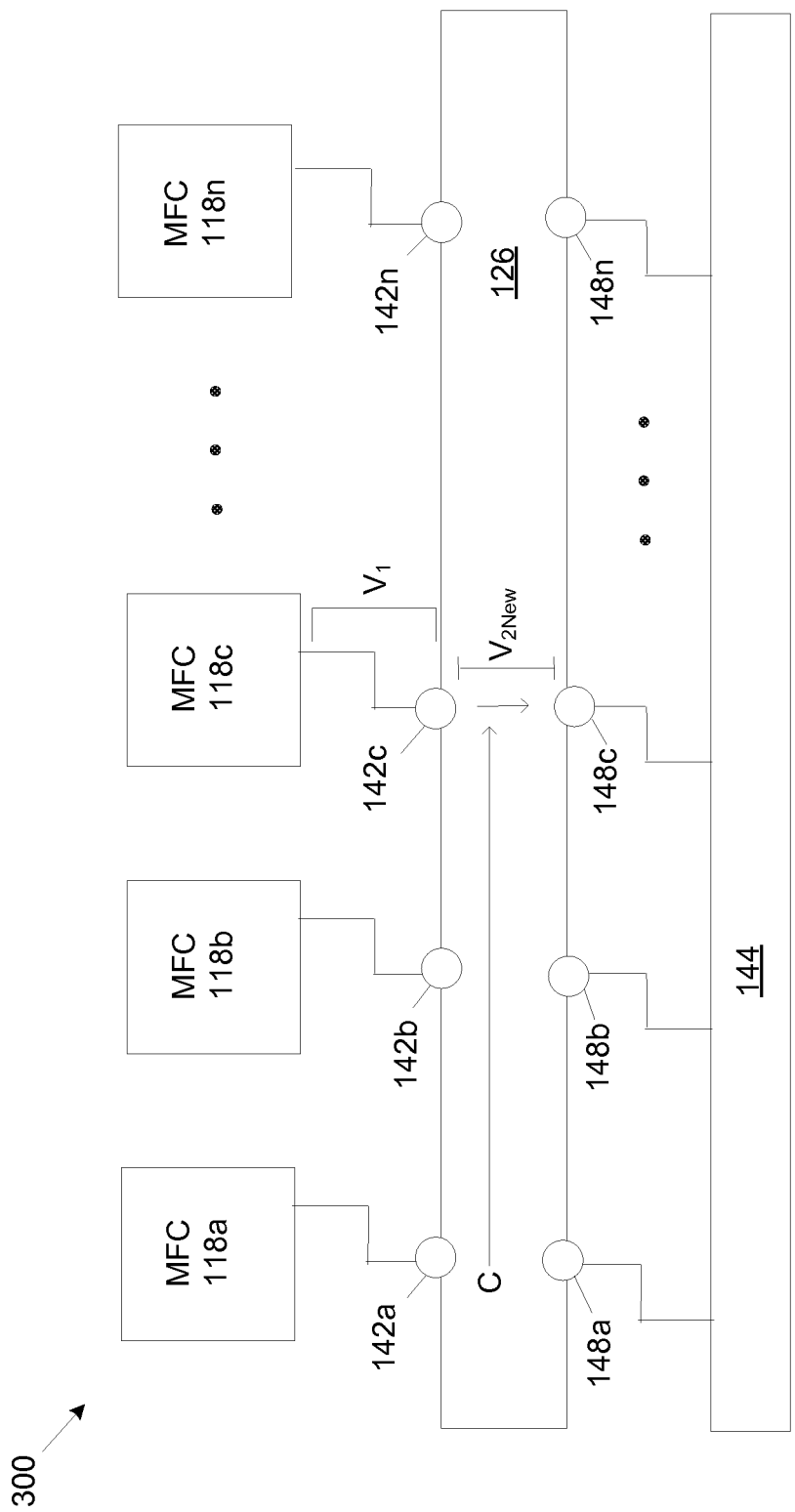
FIG. 3 is a block diagram of an exemplary mixing manifold having a plurality of mixing manifold exits.

FIG. 3 is a block diagram of an exemplary mixing manifold having a plurality of mixing manifold exits. The mixing manifold 126 may have a plurality of mixing manifold exits 148a, 148b, 148c, 148n. This allows for the flexibility to locate the mixing manifold exit 148a-n proximate or substantially close to a low flow MFC, illustrated as MFC 118c in FIG. 3, thereby minimizing delay of the low flow gas when mixing with the high flow gas. In use, the high flow gas in MFC 118a, may enter the mixing manifold 126 via gas inlet 142a. The high flow gas may then flow in the direction of flow path C toward the low flow gas entering into the mixing manifold via gas inlet 142c. The gas mixture may then exit the mixing manifold 126 via mixing manifold exit 148c. $V_{2New}$ may be the volume of gas from the gas inlet 142c to the mixing manifold exit 148c, which may be less than $V_2$ illustrated in FIG. 2.

By having multiple mixing manifold exits 148a-n and opening the mixing manifold exit 148a-n proximate or closest to the low flow MFC, this ensures that the low flow gases will mix with the high flow gases prior to exiting the mixing manifold 126. In other words, having multiple manifold exits may minimize the delay or flow time for the low flow gas to the mixing manifold exit such that the low flow gas may be able to mix with the high flow gas prior to exiting the mixing manifold 126.

As illustrated in FIG. 3, mixing manifold exits 148a, b, n may be closed and mixing manifold exit 148c may be opened as it is proximate or closer to the low flow MFC 118c than the other mixing manifold exits 148a, b, n. As the low flow gas flows from the MFC 118c to the mixing manifold 126, the high flow gas may simultaneously flow from the MFC 118a to the mixing manifold exit 148c. Just as the high flow gas reaches the mixing manifold exit 148c, it may mix with the low flow gas entering the mixing manifold via gas inlet 142c. The gas mixture may then exit the mixing manifold 126 via mixing manifold exit 148c. Thus, the delay time or lag time for the low flow gas to flow to the mixing manifold exit may be minimized.

Although illustrated with the use of two gases, the number of gases used is not intended to be limiting as any number of gases may be used to form a gas mixture. For example, MFC 118a and 118b may both be high flow gases and MFC 118c may be a low flow gas. In another example, MFC 118a may be a high flow MFC and MFC 118b and MFC 118c may both be low flow gases.

In one embodiment, the mixing manifold exits 148a-n may be any known junction that may be manually positioned in an open or closed position. In another embodiment, the mixing manifold exits 148a-n may be valves controlled via a remote server or controller, as further described with reference to FIGS. 10A and 10B. Thus, the mixing manifold exits 148a-n may be remotely and automatically controlled to be in an opened or closed position.

Additionally, MFCs may also be controlled by a remote server or controller. The MFCs may be a wide range MFC having the ability to be either a high flow MFC or a low flow MFC. The controller may be configured to control and change the flow rate of a gas in each of the MFCs. As such, the controller may be configured to monitor the flow rates of each MFC, having the ability to change the flow rate of each MFC, determine which MFC has the slowest flow rate, and control the mixing manifold exits to open the mixing manifold exit proximate the lowest flow rate MFC. This may be useful in processes such as gas modulation processes. Such a process is further described in detail in co-owned U.S. Pat. No. 6,916,746, entitled "High-Performance Etching of Dielectric Films Using Periodic Modulation of Gas Chemistry", filed Apr. 9, 2003 and is incorporated herein by reference for all purposes.

The controller may also be configured to close the mixing manifold exits that are not proximate the lowest flow MFC. However, the controller may be configured to open and close the exits as determined by a user as the user may desire to have multiple exits opened as there may be more than one low flow MFC, the user may desire to have a mixing manifold exit open proximate a high flow MFC, and the like.

Example 2

The following example is for exemplary purposes only and not intended to be limiting as any combination of gasses, flows, processes and the like may be used. In a first process the following requirement may be desired:

| MFC 118a: | high flow gas A |
|---|---|
| MFC 118b | high flow gas B |
| MFC 118c | low flow gas C |

Thus, mixing manifold exit (MME) 148a, b, n may be closed and MME 148c may be opened.

Any time thereafter, such as between about 20-60 seconds later, a second process may be desired. The second process may have the following requirements:

| MFC 118a: | low flow gas A |
| --- | --- |
| MFC 118b | high flow gas B |
| MFC 118c | high flow gas C |

Thus, mixing manifold exit (MME) 148b, c, n may be closed and MME 148a may be opened. The MFCs and the MMEs may be automatically changed via a remote computer or controller.

After the second process is complete, such as between about 20-60 second, the user may desire to revert back to the first process and/or start a third process. As will now be known, any combination of flow rates, processes, and the like may be performed using the various embodiments of the present invention.

Figure 4A:
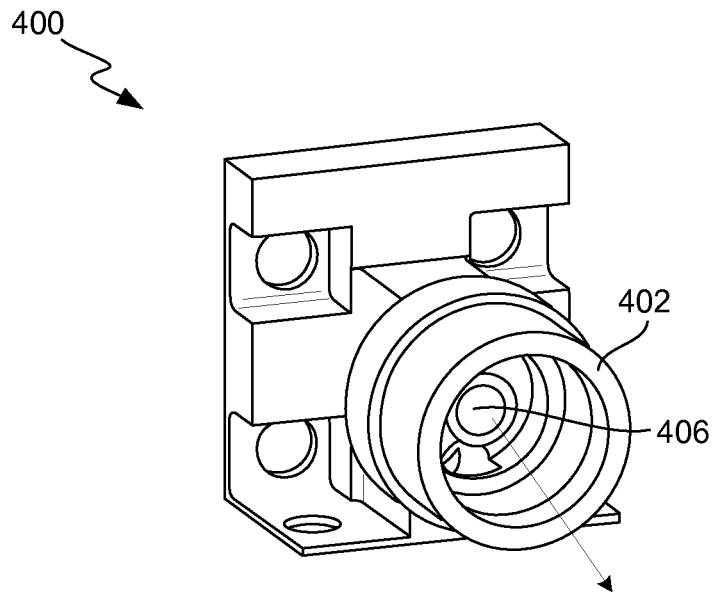
FIGS. 4A and 4B illustrate an exemplary flange to reduce the volume of a gas flow from the MFC to the mixing manifold.
Figure 4B:
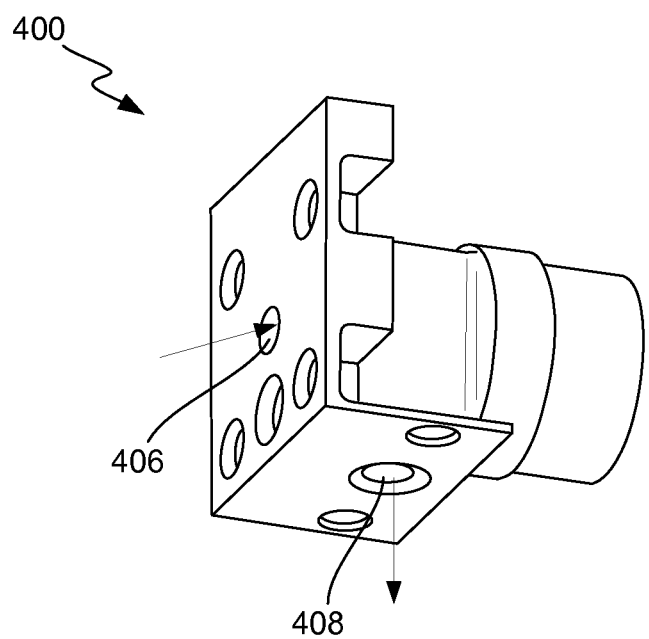

FIGS. 4A and 4B illustrate an exemplary flange to reduce the volume of a gas flow from the MFC to the mixing manifold. As discussed above, reducing the volume of gas from the MFC to the mixing manifold may reduce the flow time of a low flow gas from the MFC to the mixing manifold. FIG. 4A illustrates a front perspective view of the exemplary flange and FIG. 4B illustrates a back perspective view of the exemplary flange. The flange 400 may have a mating member 402 to mate with a gas delivery component, such as a mixing valve 120 (illustrated in FIG. 5). Although illustrated as a circular mating member 402, it will now be known that the mating member may be any shape and/or configuration as necessary to mate with any desired gas delivery component. The flange 400 may have a gas inlet port 406 in fluid communication with the gas delivery component and a gas outlet port 408 in fluid communication with the mixing manifold 126.

Figure 5:
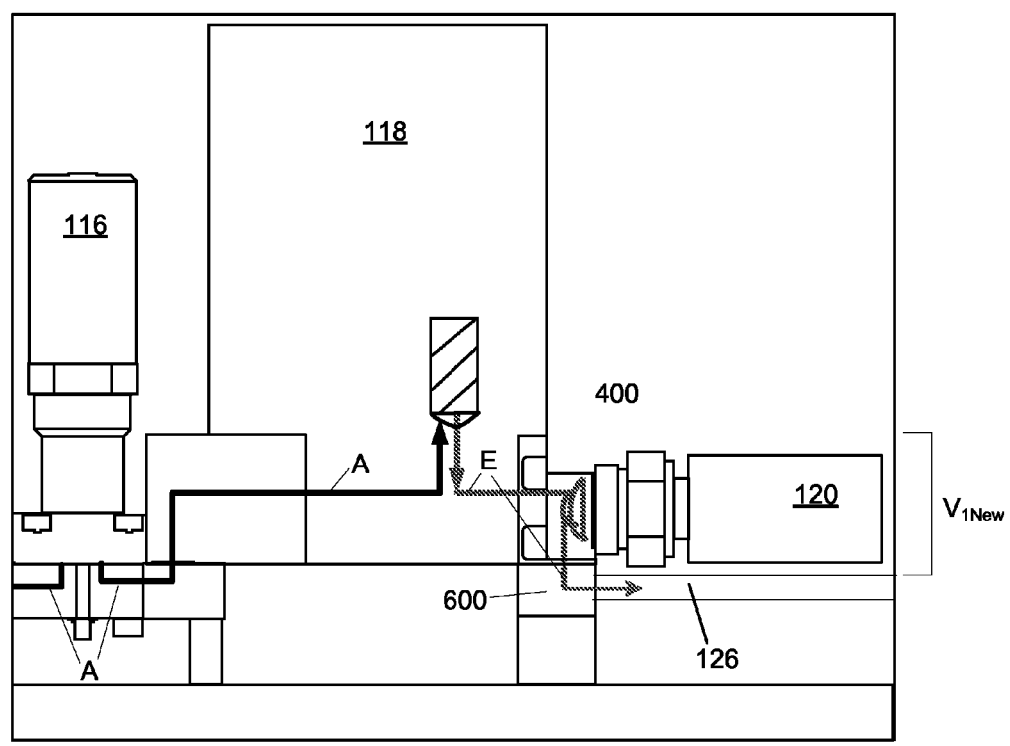
FIG. 5 illustrates the flow of gas in a gas stick using the flange of FIGS. 4A and 4B.

FIG. 5 illustrates the flow of gas in a gas stick using the flange of FIGS. 4A and 4B. The flow of gas from the purge valve 116 to the MFC 118a in the direction of flow path A is similar to the flow path as illustrated in FIG. 1B. However, the flow path from the MFC 118 to the mixing manifold 126 in the direction of flow path E has a lower volume, $V_{1New}$. The gas flows directly to the mixing manifold 126 from the MFC 118 rather than through a substrate 122 (as illustrated in FIGS. 1A and 1B). Thus, $V_{1New}$ is less than $V_1$. Additionally, $V_{1New}$ is less than 1 cc, and preferably between about 0.01 cc to 1 cc. By reducing $V_1$, the flow time delay of a low flow gas may be decreased.

Use of the flange 400 may also result in an efficient gas delivery. The gas delivery component, the mixing valve 120 as illustrated in FIG. 5, may be positioned in a horizontal position along the x-axis. Positioning the mixing valve 120 in a horizontal position allows for the low flow gas to be quickly measured and flowed vertically to the mixing manifold 126. This position not only reduces the volume, $V_{1New}$, of gas, but also allows the gas to flow quicker and uninterrupted to the mixing manifold 126.

Figure 6A:
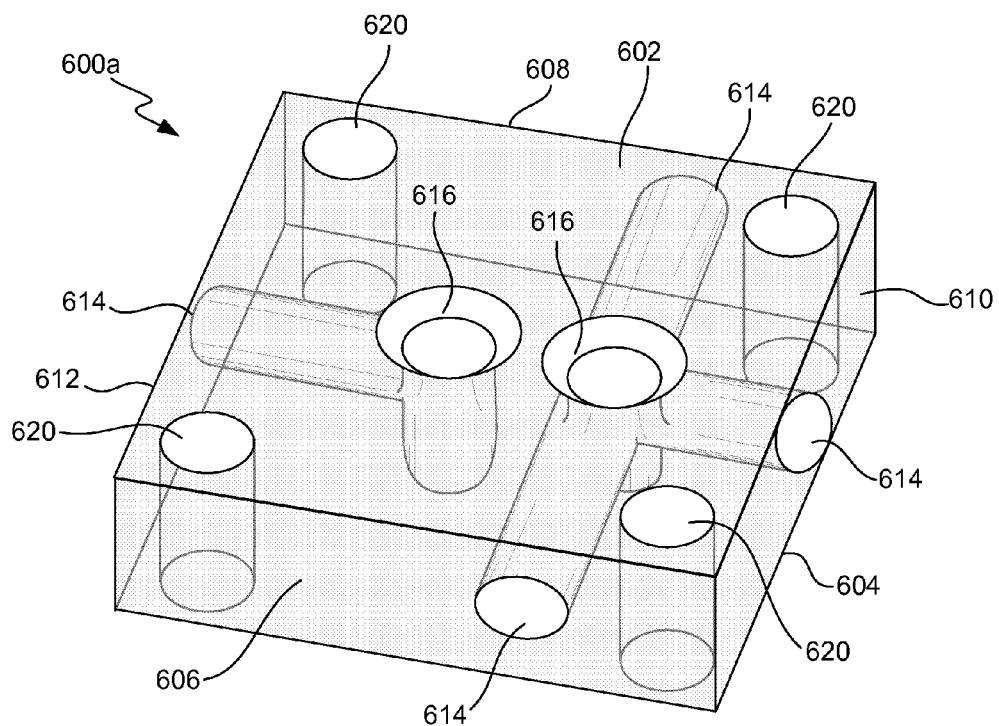
FIGS. 6A and 6B are perspective views illustrating exemplary universal fluid flow adaptors.
Figure 6B:
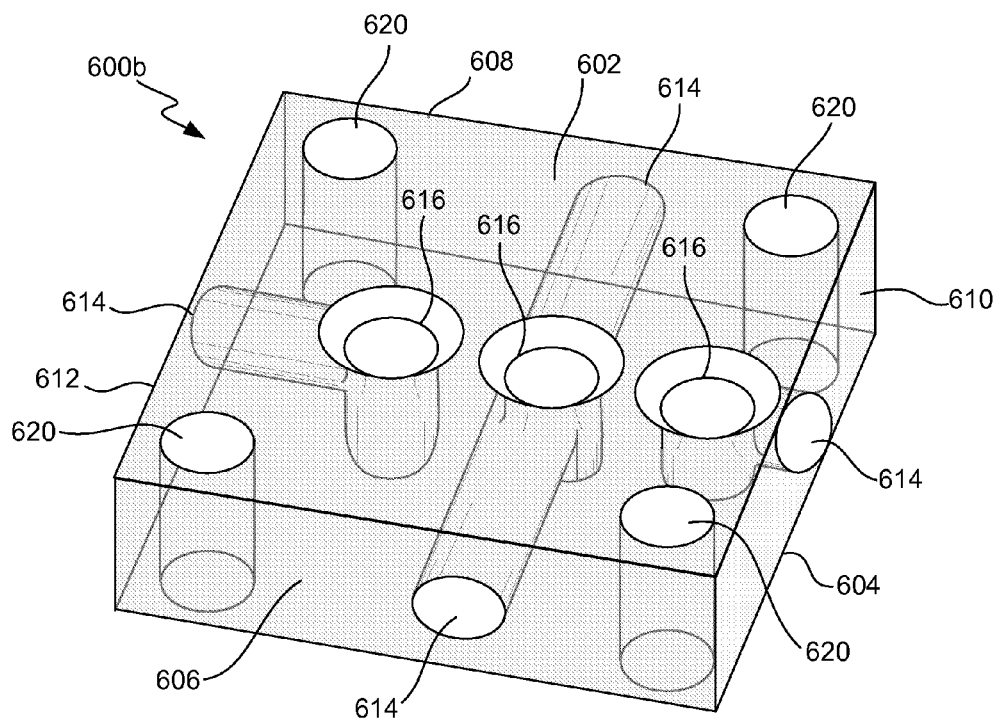

FIGS. 6A and 6B are perspective views illustrating exemplary universal fluid flow adaptors. The gas stick may also be used with a universal fluid flow adaptor 600 (also illustrated in FIG. 5) to decrease the volume of gas flow from the MFC 118 to the mixing manifold 126. FIG. 6A is a perspective view of a two-port universal fluid flow adaptor and FIG. 6B is a perspective view of a three-port universal fluid flow adaptor. Referring to FIGS. 6A and 6B, the universal fluid flow adaptor 600 may be a single structure having a top surface 602 opposite a bottom surface 604, a first side 610 opposite a second side 612, and a first end 608 opposite a second end 606. The adaptor 600 may have a plurality of vertical channels or conduits 616 to receive and communicate a gas (i.e. a gas, liquid, or combination thereof). As the term is used herein, a conduit refers to a channel, tube, routing port, pipe, or the like that permits gaseous or fluid communication between two locations. The vertical conduits 616 may extend through the adaptor 600 from the top surface 602 to the bottom surface 604 in the interior of the adaptor 600. Although the vertical conduits 616 are illustrated extending through the adaptor 600 in a straight line along the same vertical axis, it will be appreciated that the vertical conduit may having an opening on the top surface that is different that the opening on the bottom surface. For example, the vertical conduit 616 may have an opening on the top surface 602, intersect a horizontal conduit 614 within the adaptor 600, and exit the adaptor 600 at the bottom surface 604 at a location that is different from the vertical axis of the opening at the top surface 602.

As illustrated in FIG. 6A, one of the vertical conduits 616 may be an entrance port and the other vertical conduit 616 may be an exit port. As illustrated in FIG. 6B, one vertical conduit 616 may be an entrance port, another vertical conduit 616 may be an exit port, and the last vertical conduit 616 may be a discharge port. Gas delivery components, such as valves (see, e.g. FIG. 1A), may be coupled to the top surface 602 of the adaptor 600 such that gases enter into the valve through the entrance port and exit through the exit port.

The adaptor 600 may also have a plurality of horizontal channels or conduits 614 to receive and communicate the gas. The horizontal conduits 614 may extend through the first side 610 to the second side 612 and/or from the first end 608 to the second end 606 in the interior of the adaptor 600. As illustrated, the vertical conduits 616 may converge with the horizontal conduit 614 at the interior of the adaptor 600 and the horizontal conduits 614 may converge with each other to form at least one cross-shaped or t-shaped conduit. Thus, a gas may have at least four different flow paths from which to flow.

The adaptor 600 may also have a plurality of apertures 620. Although illustrated with the apertures 620 extending through the top surface 602 to the bottom surface 604, the apertures may only extend partially through the top surface 602 or the bottom surface 604. Additionally, the apertures 620 may be threaded or designed to receive an attachment means, such as a screw, to couple the adaptors 600 to a gas delivery component or a flange 400 (FIG. 5).

Additional universal fluid flow adaptors that may be used with the various embodiments discussed herein are further discussed in detail in co-pending application Ser. No. 60/979,788, entitled "Universal Fluid Flow Adaptor", filed on Oct. 12, 2007, and co-pending application Ser. No. 11/761,326, entitled "Flexible Manifold For Integrated Gas System Gas Panels", filed on Jun. 11, 2007, both of which are incorporated herein by reference for all purposes.

Figure 7:
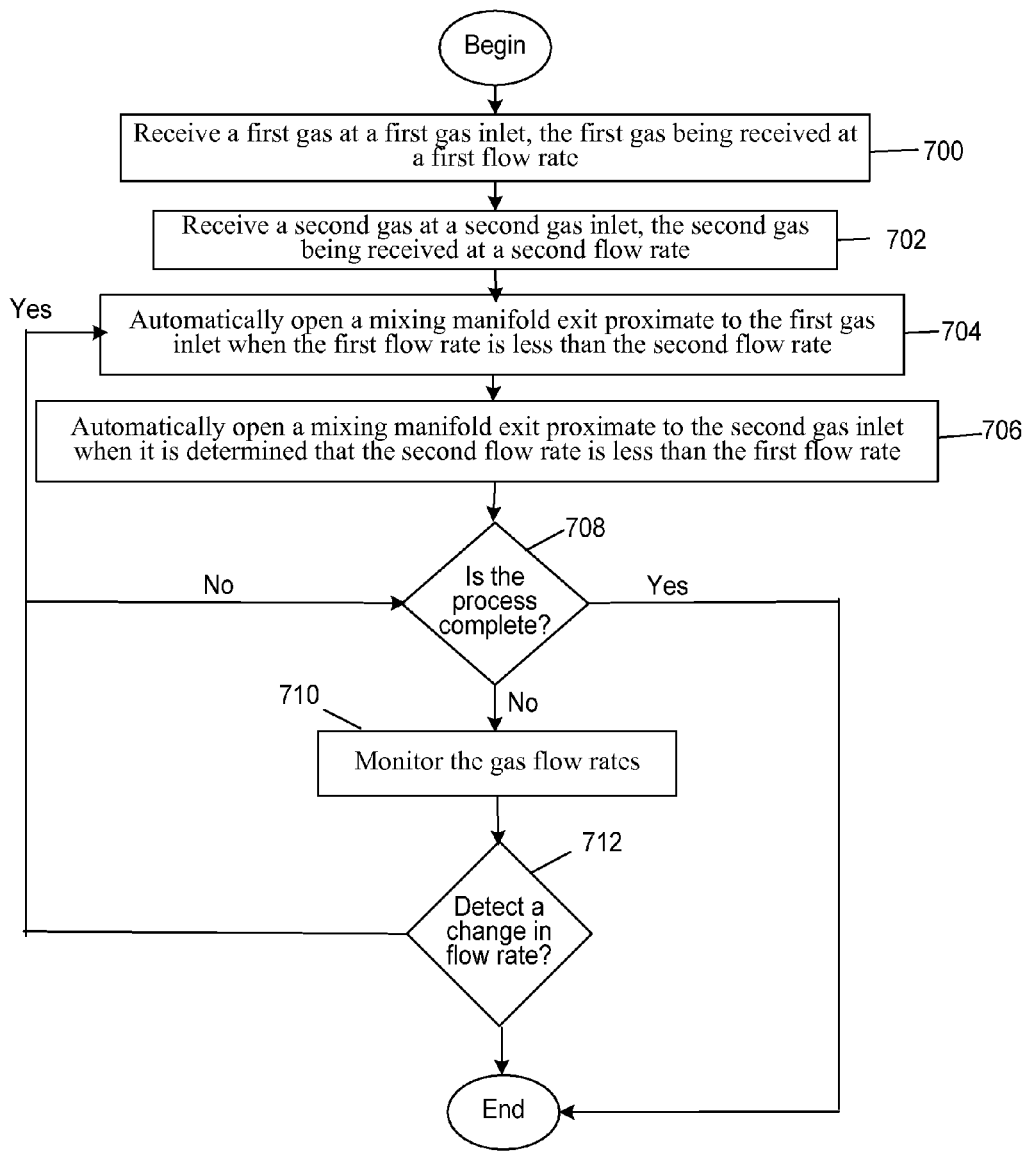
FIG. 7 is a flow diagram of an exemplary method for dynamically mixing a plurality of gases.

FIG. 7 is a flow diagram of a method for dynamically mixing a plurality of gases. Although illustrated with the use of two gases, it will now be known that any number of gases may be used to form any desired gas mixture. Additionally, the term gas used herein is not intended to be limiting and is meant to include any liquid, gas, or a combination of liquid and gas. A first gas may be received at a first gas inlet to a mixing manifold, the first gas being received at a first flow rate at 700. A second gas may be received at a second gas inlet to the mixing manifold, the second gas being received at a second flow rate at 702.

The first and second gases may be flowed into a mixing manifold having a plurality of mixing manifold exits. This allows for the flexibility to locate the mixing manifold exit near a low flow MFC to minimizing the delay of the low flow gas from mixing with the high flow gas to ensure that the low flow gases will mix with the high flow gases prior to exiting the mixing manifold. In other words, having multiple manifold exits and/or having a manifold exit located proximate or substantially close to a low flow MFC provides the low flow gas time to flow into the mixing manifold such that it will flow into the mixing manifold in time to mix with the high flow gas prior to exiting the mixing manifold exit.

A determination may be made as to which of the first flow rate and the second flow rate is slower. A mixing manifold exit proximate to the first gas inlet may be automatically opened when it is determine that the first flow rate is less than the second flow rate at 704. Otherwise, the mixing manifold exit proximate to the second gas inlet may be automatically opened when it is determine that the second flow rate is less than the first flow rate at 706. The mixing manifold exits may be manually controlled or remotely controlled in an opened or closed position. The mixing manifold exits may be valves controlled via a remote server or controller, as further described with reference to FIGS. 10A and 10B. Thus, the mixing manifold exits may be remotely and automatically controlled to be in an opened or closed position.

If the process is not complete at 708, the gas flow rates may be monitored at 710. Each MFCs may be controlled by a remote server or controller. Each MFC may be a wide range MFC having the ability to be either a high flow MFC or a low flow MFC. The controller may be configured to control and change the flow rate of a gas in each of the MFCs. As such, the controller may be configured to monitor the flow rates of each MFC, having the ability to dynamically change the flow rate of each MFC, determine which MFC has the slowest flow rate, and control the mixing manifold exits to open the mixing manifold exit proximate the lowest flow rate MFC and/or close the mixing manifolds that are not proximate the lowest flow rate MFC. Should the controller detect a change in the flow rate at 712, the process may repeat from 706. As such, the second inlet proximate to a second mixing manifold exit may automatically be opened when it is determined that the second flow rate is less than the first flow rate.

Figure 8:
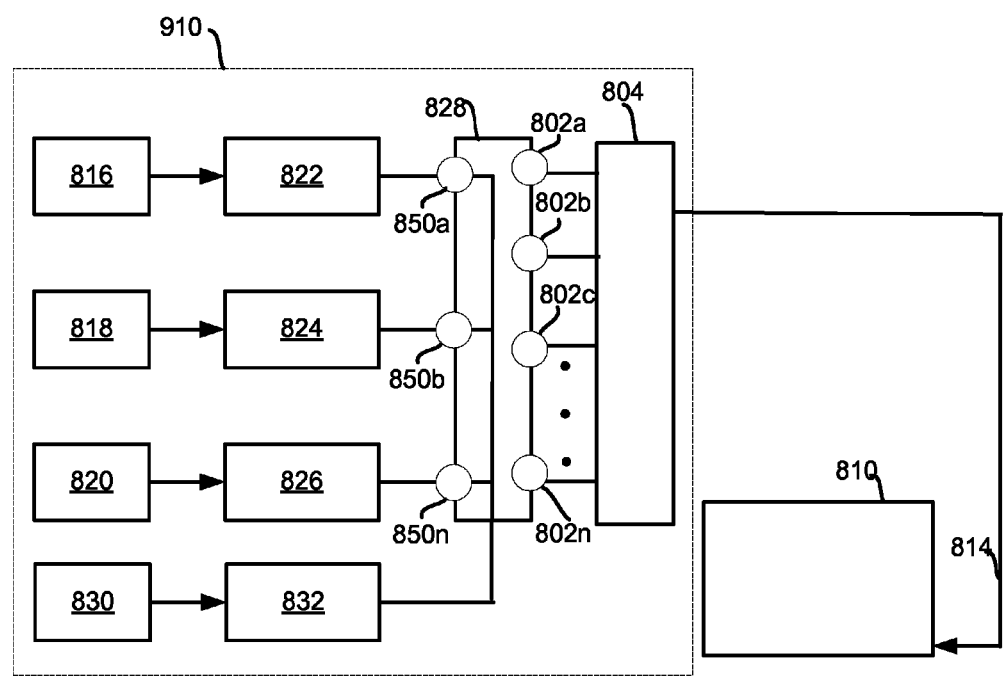
FIG. 8 is a schematic view of an exemplary gas feed device for semiconductor processing.

The embodiments described above may be used in various applications. For example, FIG. 8 is a schematic view of an exemplary gas feed device for semiconductor processing. A plasma processing chamber 810 is supplied processing gas through gas supply line 814. The gas supply line 812 may provide process gas to a showerhead or other gas supply arrangement arranged in the upper portion of the chamber. Additionally, gas supply line 814 may supply processing gas to a lower portion of the chamber such as, for example, to a gas distribution ring surrounding the substrate holder or through gas outlets arranged in the substrate support. However, an alternative dual gas feed arrangement can supply gas to the top center and top perimeter of the chamber. Processing gas may be supplied to gas line 814 from gas supplies 816, 818, 820, 830 the process gasses from supplies 816, 818, 820, 830 being supplied to MFC 822, 824, 826, 832 respectively. The MFC 822, 824, 826, 832 supply the process gasses to a mixing manifold 828 having a plurality of mixing manifold exits 802*a*, 802*b*, 802*c*, 802*n* after which the mixed gas is directed to an isolation chamber 804. The mixed gas may then be directed to gas flow line 814.

In operation, the user may select the fraction of mixed flow to be delivered to the plasma processing chamber. For example, the user might select a flow of 250 sccm Ar/30 sccm $C_4F_8$/15 sccm $C_4F_6$/22 sccm $O_2$ delivered through line 814. By comparing the total flow, which in this case could be measured by summing all of the flow readouts of the MFC 822, 824, 826, 832 in the gas box, the controller can adjust the degree of throttling in line 814 to achieve the desired flow distribution. Alternatively, an optional total flow meter could be installed just downstream of the mixing manifold 828 to measure the total flow of mixed gas, rather than determining the total flow by summing the readouts of the MFCs 822, 824, 826, 832 in the gas box.

Figure 9:
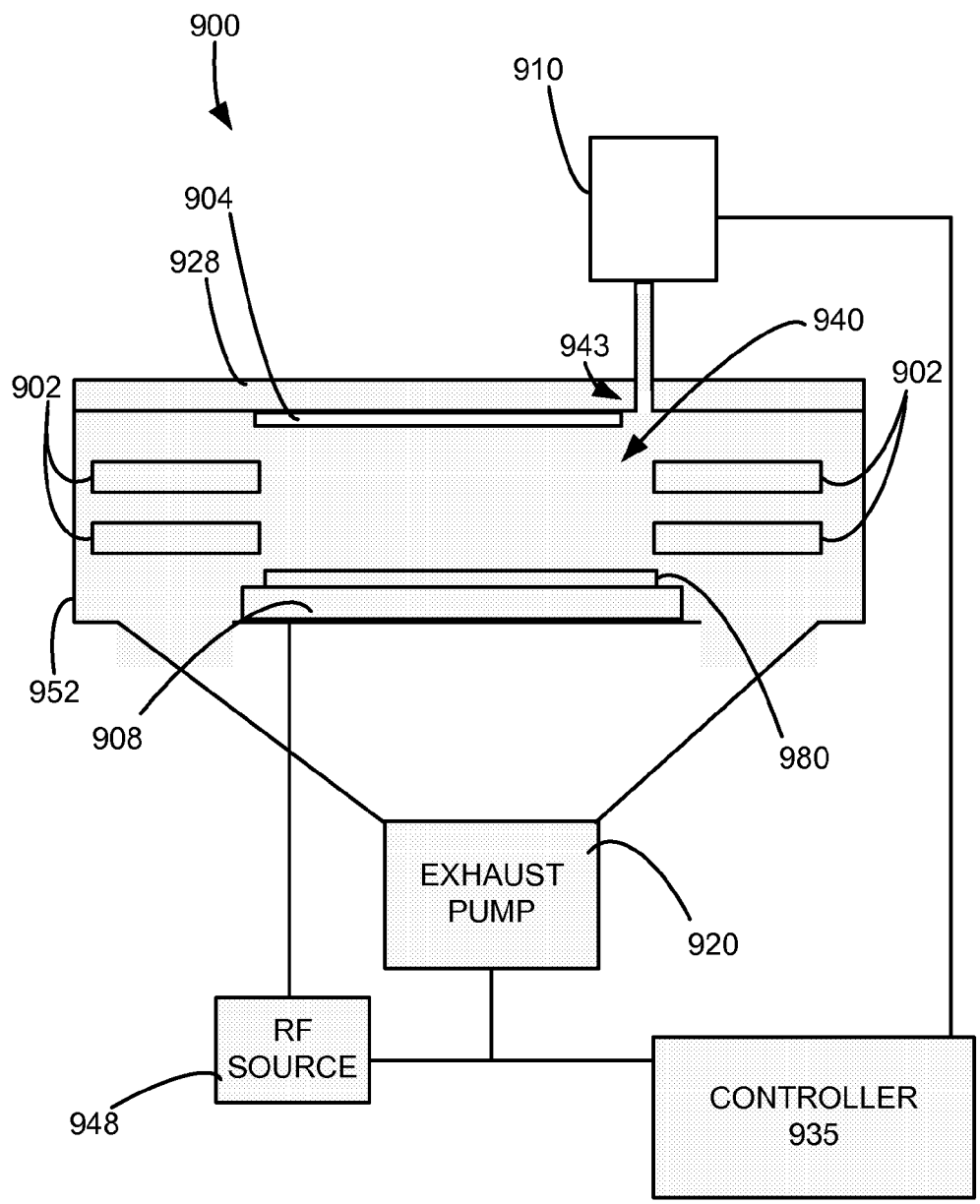
FIG. 9 illustrates a schematic view of another exemplary plasma processing chamber.

In another example, FIG. 9 illustrates a schematic view of another exemplary plasma processing chamber 900 that may be used in embodiments of the invention. The plasma processing chamber 900 may comprise confinement rings 902, an upper electrode 904, a lower electrode 908, a gas source 910, and an exhaust pump 920. The gas source 910 may be substantially similar to the gas source 910 discussed with reference to FIG. 8 and will not be discussed herein. Within plasma processing chamber 900, the substrate wafer 980, over which the oxide layer is deposited, is positioned upon the lower electrode 908. The lower electrode 908 incorporates a suitable substrate chucking mechanism (e.g., electrostatic, mechanical clamping, or the like) for holding the substrate wafer 980. The reactor top 928 incorporates the upper electrode 904 disposed immediately opposite the lower electrode 908. The upper electrode 904, lower electrode 908, and confinement rings 902 define the confined plasma volume 940. Gas is supplied to the confined plasma volume by gas source 910 through a gas inlet 943 and is exhausted from the confined plasma volume through the confinement rings 902 and an exhaust port by the exhaust pump 920. The exhaust pump 920 forms a gas outlet for the plasma processing chamber. An RF source 948 is electrically connected to the lower electrode 908. Chamber walls 952 define a plasma enclosure in which the confinement rings 902, the upper electrode 904, and the lower electrode 908 are disposed. The RF source 948 may comprise a 27 MHz power source and a 2 MHz power source. Different combinations of connecting RF power to the electrodes are possible.

An 2300 Exelan™ dielectric etch system made by Lam Research Corporation™ of Fremont, Calif. modified to provide the cycle time required by the invention may be used in a preferred embodiment of the invention. A controller 935 is controllably connected to the RF source 948, the exhaust pump 920, and the plurality of mixing manifold exits 802*a-n* and gas inlets 850*a-n* (FIG. 8) of gas source 910. A showerhead may be connected to the gas inlet 943. The gas inlet 943 may be a single inlet for each gas source or a different inlet for each gas source or a plurality of inlets for each gas source or other possible combinations.

Figure 10A:
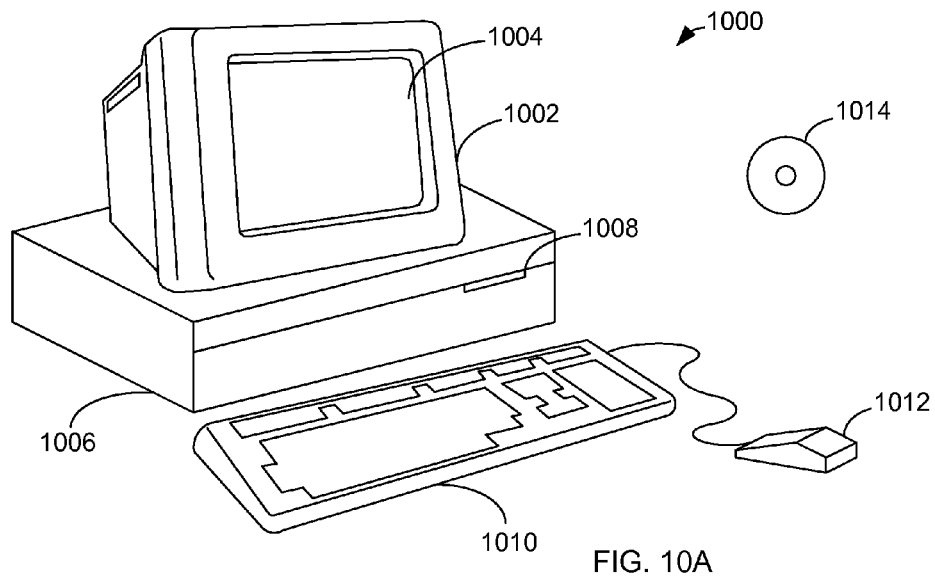
FIGS. 10A and 10B illustrate an exemplary computer system, which forms part of the network, and is suitable for providing a controller system.
Figure 10B:
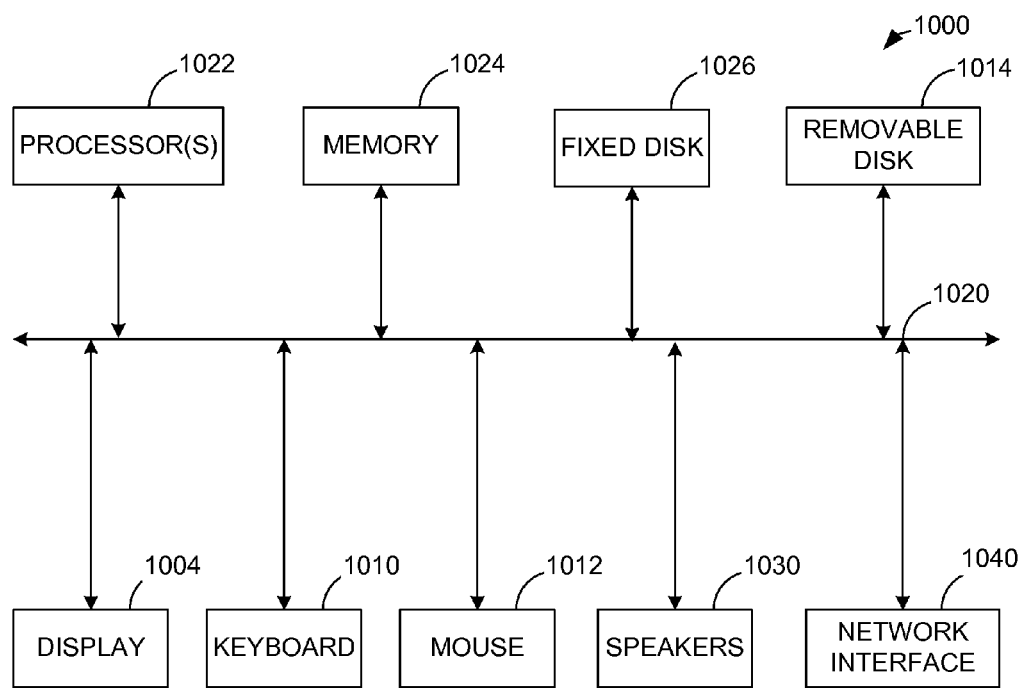

FIGS. 10A and 10B illustrate a computer system 1000, which is suitable for implementing a controller used in embodiments of the present invention. FIG. 10A shows one possible physical form of the computer system. Of course, the computer system may have many physical forms ranging from an integrated circuit, a printed circuit board, and a small handheld device up to a huge super computer. Computer system 1000 includes a monitor 1002, a display 1004, a housing 1006, a disk drive 1008, a keyboard 1010, and a mouse 1012. Disk 1014 is a computer-readable medium used to transfer data to and from computer system 1000.

FIG. 10B is an example of a block diagram for computer system 1000. Attached to system bus 1020 are a wide variety of subsystems. Processor(s) 1022 (also referred to as central processing units, or CPUs) are coupled to storage devices, including memory 1024. Memory 1024 includes random access memory (RAM) and read-only memory (ROM). As is well known in the art, ROM acts to transfer data and instructions uni-directionally to the CPU and RAM is used typically to transfer data and instructions in a bi-directional manner.

Both of these types of memories may include any suitable of the computer-readable media described below. A fixed disk 1026 is also coupled bi-directionally to CPU 1022; it provides additional data storage capacity and may also include any of the computer-readable media described below. Fixed disk 1026 may be used to store programs, data, and the like and is typically a secondary storage medium (such as a hard disk) that is slower than primary storage. It will be appreciated that the information retained within fixed disk 1026 may, in appropriate cases, be incorporated in standard fashion as virtual memory in memory 1024. Removable disk 1014 may take the form of any of the computer-readable media described below.

CPU 1022 is also coupled to a variety of input/output devices, such as display 1004, keyboard 1010, mouse 1012 and speakers 1030. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1022 optionally may be coupled to another computer or telecommunications network using network interface 1040. With such a network interface, it is contemplated that the CPU might receive information from the network, or might output information to the network in the course of performing the above-described method steps. Furthermore, method embodiments of the present invention may execute solely upon CPU 1022 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 11:
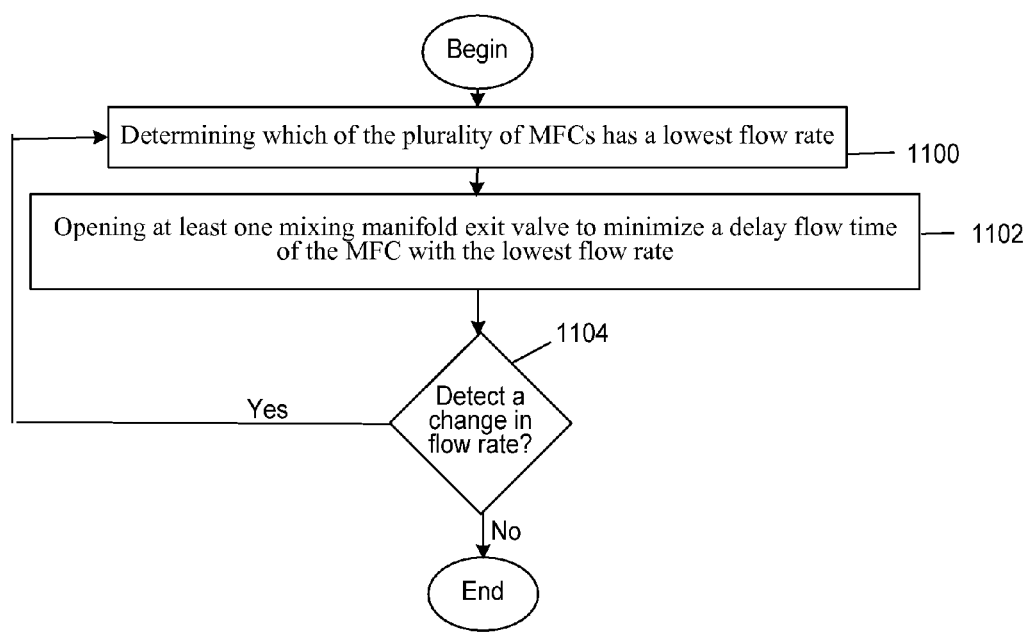
FIG. 11 is a flow diagram of an exemplary method for controlling a plurality of mixing manifold exit valves.

FIG. 11 is a flow diagram of an exemplary method for controlling a plurality of mixing manifold exit valves. As stated above, the gas source may be controlled by a remote controller. The remote controller may be configured to communicate with the plurality of MFCs in the gas source to determine whether each MFC is opened or closed and determine the flow rate of each MFC. The remote controller may have computer readable code for determining which of the plurality of MFCs has a lowest flow rate at 1100.

The remote controller may also be configured to communicate with the plurality of mixing manifold exit valves in the gas source to open and/or close each of the plurality of mixing manifold exits on the mixing manifold. The remote controller may have computer readable code for opening at least one mixing manifold exit valves to minimize a delay flow time or lag time of the MFC with the lowest flow rate at 1102. Thus, the delay time or lag time for the low flow gas to flow from the MFC to the mixing manifold exit may be minimized.

The remote controller may continue to monitor the flow rate of each of the plurality of MFCs and have computer readable code for determining when there is a change in any of the MFC flow rates at 1104. In another embodiment, the remote controller may automatically change the flow rate of any of the plurality of MFCs. Should the remote controller detect a chance in a flow rate, the remote controller may repeat the process from step 1100.

While embodiments and applications of this invention have been shown and described, it would be apparent to those skilled in the art having the benefit of this disclosure that many more modifications than mentioned above are possible without departing from the inventive concepts herein.

What is claimed is:

1. An apparatus for providing a gas mixture of a plurality of gases, comprising:
   a plurality of mass flow controllers (MFCs);
   a mixing manifold in fluid connection with each of the plurality of MFCs;
   a plurality of mixing manifold exit valves positioned on the mixing manifold; and
   an isolation chamber in fluid connection with each of the plurality of mixing manifold exit valves.

2. The apparatus of claim 1, further comprising a mounting flange in fluid communication with each of the plurality of MFCs and the mixing manifold.

3. The apparatus of claim 2, wherein the mounting flange further comprises:
   a gas inlet port in fluid communication with the MFC; and
   a gas outlet port in direct fluid communication with the mixing manifold.

4. The apparatus of claim 3, wherein the flange is in fluid communication with a gas delivery component, wherein the gas delivery component is positioned in a horizontal position.

5. The apparatus, as recited in claim 1, wherein each of the plurality of mixing manifold exit valves is between the mixing manifold and the isolation chamber.

6. An apparatus for providing a gas mixture of a plurality of gases, comprising:
   a plurality of mass flow controllers (MFCs);
   a mixing manifold in fluid connection with each of the plurality of MFCs;
   a plurality of mixing manifold exits positioned on the mixing manifold, wherein the plurality of mixing manifold exits are mixing manifold exit valves;
   an isolation device in fluid connection with each of the plurality of mixing manifold exits; and
   a computer configured to communicate with each mixing manifold exit valves to open and/or close each of the mixing manifold exits, wherein each of the plurality of MFCs is either open or closed and wherein each open MFC has a flow rate, wherein the computer comprises computer readable media, comprising:
   computer readable code for determining which of the plurality of MFCs has a lowest flow rate; and
   computer readable code for opening one of the plurality of mixing manifold exit valves, wherein the open mixing manifold exit valve minimizes a delay flow time of the MFC with the lowest flow rate.

7. The apparatus of claim 6, wherein the computer readable media further comprises:
   computer readable code for determining when there is a change in each of the MFC flow rates; and computer readable code for determining the MFC with the lowest flow rate.

8. The apparatus, as recited in claim 6, wherein each of the plurality of mixing manifold exits is between the mixing manifold and the isolation device.

9. An apparatus for providing a gas mixture of a plurality of gases, comprising:
   a plurality of mass flow controllers (MFCs);
   a mixing manifold in fluid connection with each of the plurality of MFCs;
   a plurality of mixing manifold exits positioned on the mixing manifold; and
   an isolation device in fluid connection with each of the plurality of mixing manifold exits, wherein a volume of a gas between one of the plurality of MFCs and the mixing manifold is less than 1 cubic centimeter (cc).

10. The apparatus of claim 9, wherein the volume is between 0.01 cc-1 cc.

11. A method for controlling a plurality of mixing manifold exit valves, wherein each mixing manifold exit valve controls a mixing manifold exit, wherein each mixing manifold exit is connected between a mixing manifold and an isolation device, wherein a plurality of mass flow controllers (MFCs) are either open or closed, wherein each of the plurality of MFC's is in fluid connection with the mixing manifold, and wherein each open MFC has a flow rate, wherein a computer comprises computer readable media, comprising:
   determining which of the plurality of MFCs has a lowest flow rate; and
   opening one of the plurality of mixing manifold exit valves, wherein the one open mixing manifold exit valve minimizes a delay flow time of the MFC with the lowest flow rate.

12. The method of claim 11, wherein the open mixing manifold exit valve controls a mixing manifold exit closest to the MFC with the lowest flow rate.

13. The method of claim 11, further comprising:
   determining when there is a change in each of the MFC flow rates;
   determining the MFC with the lowest flow rate; and
   opening one of the plurality of mixing manifold exit valves, wherein the open mixing manifold exit valve minimizes a delay flow time of the MFC with the lowest flow rate.

14. The method of claim 11, wherein a volume of a gas between one of the plurality of MFCs and the mixing manifold is less than 1 cubic centimeter (cc).

15. The method of claim 14, wherein the volume is between 0.01 cc-1 cc.

16. The method of claim 11, further comprising dynamically changing at least one flow rate.

* * * * *